(12) United States Patent
Yonezawa et al.

(10) Patent No.: US 12,635,436 B2
(45) Date of Patent: May 19, 2026

(54) PLASMA PROCESSING METHOD AND PLASMA PROCESSING SYSTEM

(71) Applicant: Tokyo Electron Limited, Tokyo (JP)

(72) Inventors: Takahiro Yonezawa, Kurokawa-gun (JP); Kenta Ono, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 238 days.

(21) Appl. No.: 18/339,021

(22) Filed: Jun. 21, 2023

(65) Prior Publication Data

US 2024/0006188 A1 Jan. 4, 2024

(30) Foreign Application Priority Data

Jun. 29, 2022 (JP) ................................. 2022-104849
May 2, 2023 (JP) ................................. 2023-076003

(51) Int. Cl.
H10P 50/00 (2026.01)
H10P 50/28 (2026.01)
*H01J 37/32* (2006.01)

(52) U.S. Cl.
CPC ............ H10P 50/73 (2026.01); H10P 50/283 (2026.01); *H01J 37/32082* (2013.01); *H01J 2237/332* (2013.01); *H01J 2237/334* (2013.01)

(58) Field of Classification Search
None
See application file for complete search history.

(56) References Cited

U.S. PATENT DOCUMENTS

2019/0206723 A1* 7/2019 Tokashiki ......... H01L 21/30655
2021/0242032 A1* 8/2021 Colinjivadi ....... H01L 21/31144
2021/0358717 A1* 11/2021 Kim .................... H01L 21/3065

FOREIGN PATENT DOCUMENTS

JP 2018-006742 A 1/2018

* cited by examiner

*Primary Examiner* — Roberts P Culbert
(74) *Attorney, Agent, or Firm* — PROCOPIO, CORY, HARGREAVES & SAVITCH LLP

(57) ABSTRACT

Provided is a plasma processing method performed with a plasma processing apparatus including a chamber. The method includes: (a) preparing a substrate on a substrate support in the chamber, the substrate including an etching target film and a metal-containing film disposed on the etching target film, the metal-containing film including a side face defining at least one opening on the etching target film; (b) forming a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

24 Claims, 5 Drawing Sheets

PLASMA PROCESSING METHOD AND PLASMA PROCESSING SYSTEM

CROSS-REFERENCE TO RELATED APPLICATIONS

The present application claims priority under 35 U.S.C. § 119 to Japanese Patent Application No. 2022-104849 filed on Jun. 29, 2022 and Japanese Patent Application No. 2023-76003 filed on May 2, 2023, the entire contents of which are incorporated herein by reference.

BACKGROUND

Field

Exemplary embodiments of the present disclosure relate to plasma processing methods and plasma processing systems.

Description of Related Art

JP2018-6742A discloses a technique of using a thin tin oxide film as a spacer for a pattern forming method to manufacture semiconductor devices.

SUMMARY

In one exemplary embodiment of the present disclosure, a plasma processing method is provided, which is performed with a plasma processing apparatus including a chamber. The method includes: (a) preparing a substrate on a substrate support in the chamber, the substrate including an etching target film and a metal-containing film, the metal-containing film being formed on the etching target film and including a side face defining at least one opening on the etching target film; (b) forming a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

DETAILED DESCRIPTION

Figure 1:
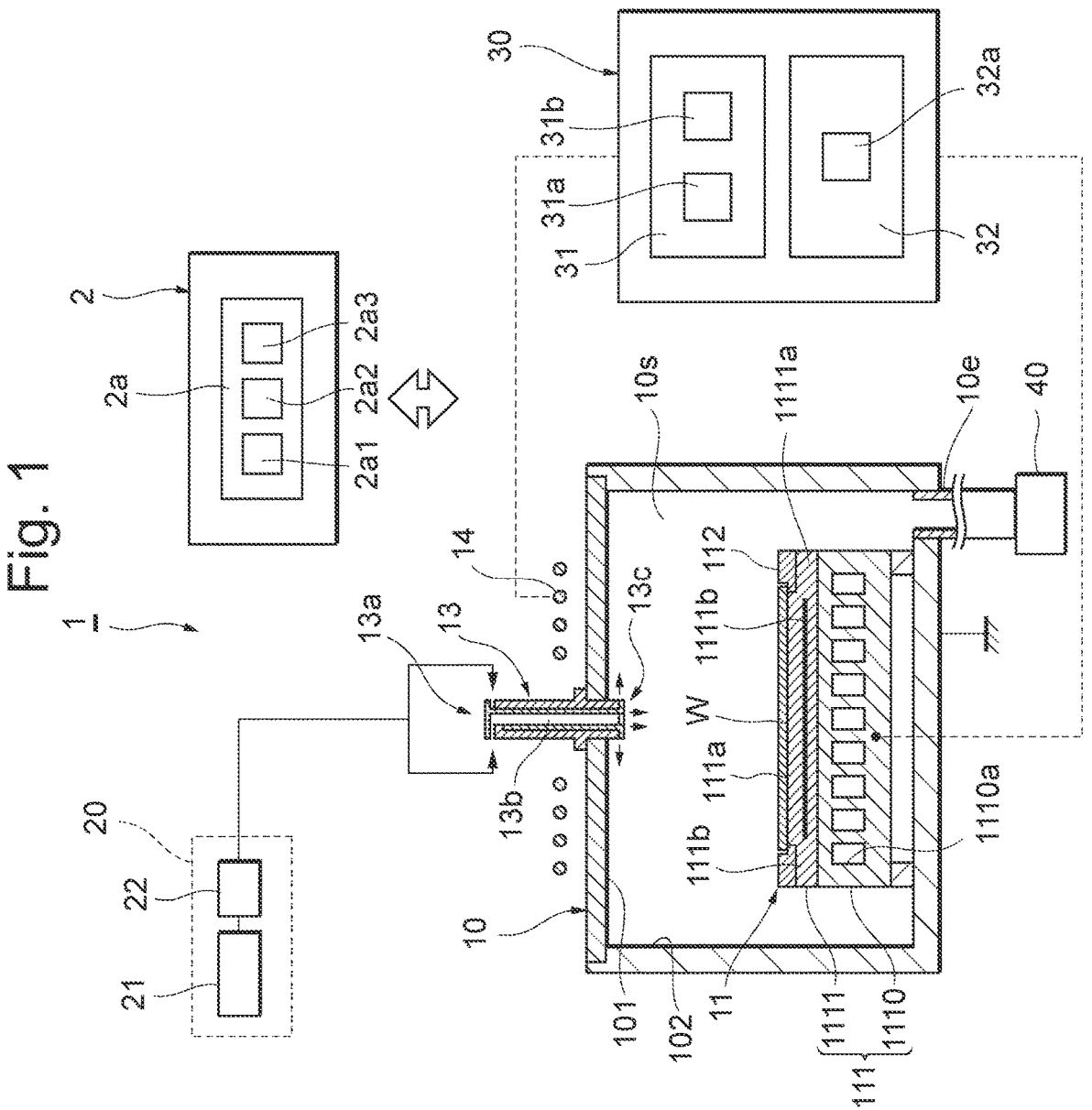
FIG. 1 illustrates a configuration example of an inductively coupled plasma processing apparatus.

The following describes embodiments of the present disclosure.

In one exemplary embodiment, a plasma processing method is provided, which is performed with a plasma processing apparatus including a chamber. The method includes: (a) preparing a substrate on a substrate support in the chamber, the substrate including an etching target film and a metal-containing film, the metal-containing film being formed on the etching target film and including a side face defining at least one opening on the etching target film; (b) forming a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

In one exemplary embodiment, the metal-containing film includes at least one selected from the group consisting of Sn, Hf, In, Ti and Zr.

In one exemplary embodiment, the metal-containing film includes Sn.

In one exemplary embodiment, the metal-containing film includes an EUV resist film containing Sn.

In one exemplary embodiment, in (b), the plasma formed from the first processing gas is used to etch the surface of the metal-containing film and form the deposited film.

In one exemplary embodiment, the first processing gas includes a gas containing silicon or metal and halogen.

In one exemplary embodiment, the first processing gas includes at least one selected from the group consisting of $SiCl_4$ gas, $SiF_4$ gas, $TiCl_4$ gas, $WF_6$ gas, and $MoF_6$ gas.

In one exemplary embodiment, in (b), the plasma formed from the first processing gas is used to form the deposited film without substantially etching the surface of the metal-containing film.

In one exemplary embodiment, the first processing gas includes a gas containing carbon and hydrogen.

In one exemplary embodiment, the first processing gas includes at least one selected from the group consisting of $CH_4$ gas, $CH_2F_2$ gas and $CH_3F$ gas.

In one exemplary embodiment, the first processing gas includes both a gas containing silicon or metal and halogen, and a gas containing carbon and hydrogen.

In one exemplary embodiment, in (b), no bias signal is supplied to the substrate support.

In one exemplary embodiment, the second processing gas includes a gas containing halogen other than fluorine or hydrogen-containing gas.

In one exemplary embodiment, the second processing gas includes at least one selected from the group consisting of HBr gas, $Br_2$ gas, HCl gas, $Cl_2$ gas and $H_2$ gas.

In one exemplary embodiment, the second processing gas further includes at least one of an oxygen-containing gas and an inert gas.

In one exemplary embodiment, (b) and (c) are repeated.

In one exemplary embodiment, the period for performing (b) and the period for performing (c) at least partially overlap.

In one exemplary embodiment, (b) and (c) are performed simultaneously.

One exemplary embodiment further includes removing at least a portion of the side face of the metal-containing film using a plasma formed from the second processing gas after (a) and before (b).

In one exemplary embodiment, in (c), a portion of the side face of the metal-containing film that extends toward the opening is removed using a plasma formed from the second processing gas.

One exemplary embodiment further includes, after step (c), etching the etching target film using the metal-containing film with the deposited film formed thereon as a mask.

In one exemplary embodiment, (c) includes etching the etching target film using the metal-containing film with the deposited film formed thereon as a mask.

In one exemplary embodiment, a plasma processing method is provided, which is performed with a plasma processing apparatus including a chamber. The method includes: (a) preparing a substrate on a substrate support in the chamber, the substrate including an etching target film and a metal-containing film, the metal-containing film being formed on the etching target film and including a side face defining at least one opening on the etching target film; and (b) forming a deposited film on at least a portion of the surface of the metal-containing film using a plasma formed from a first processing gas, the first processing gas including a gas containing silicon, carbon or metal.

One exemplary embodiment further includes, after step (b), etching the etching target film using the metal-containing film with the deposited film formed thereon as a mask.

In one exemplary embodiment, a plasma processing method is provided, which is performed with a plasma processing apparatus including a chamber. The method includes: (a) preparing a substrate on a substrate support in the chamber, the substrate including an etching target film and a metal-containing film, the metal-containing film being formed on the etching target film and including a side face defining at least one opening on the etching target film; (b) supplying a processing gas into the chamber; and (c) forming a plasma from the processing gas. In the method, (c) repeats: (c1) a first period of supplying a bias signal at a first level to the substrate support; and (c2) a second period of not supplying a bias signal to the substrate support, or supplying a bias signal at a second level that is lower than the first level to the substrate support.

In one exemplary embodiment, the processing gas includes at least one selected from the group consisting of $CH_4$ gas, $CH_3F$ gas, $CH_2F_2$ gas, $CHF_3$ gas, $CCl_4$ gas, $CHCl_3$ gas, $CH_2Cl_2$ gas, $CH_3Cl$ gas, $SiCl_4$ gas, $Si_2Cl_6$ gas, $SiF_4$ gas, $SiH_4$ gas, $WF_6$ gas, $MoF_6$ gas, $TiCl_4$ gas, $SnCl_4$ gas, $H_2$ gas, HF gas, HCl gas, HBr gas, $Cl_2$ gas, $Br_2$ gas, and $N_2$ gas.

In one exemplary embodiment, in (c), in the first period, a source RF signal is supplied at a third level, and in the second period, a source RF signal is not supplied or is supplied at a fourth level lower than the third level.

In one exemplary embodiment, a plasma processing system includes a chamber, a substrate support disposed in the chamber, a plasma generator, and a controller. The controller is configured to perform (a) preparing a substrate on a substrate support in the chamber, the substrate including an etching target film and a metal-containing film disposed on the etching target film, the metal-containing film including a side face defining at least one opening on the etching target film; (b) controlling to form a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

The following describes embodiments of the present disclosure in details with reference to the drawings. Like reference numerals designate like elements in the drawings to omit their duplicated descriptions. Unless otherwise specified, positional relationships such as top, bottom, left, and right will be described based on the positional relationships illustrated in the drawings. The accompanying drawings have not necessarily been drawn to scale, and the actual proportions are not limited to the illustrated ones.
Configuration Example of Plasma Processing System The following describes a configuration example of a plasma processing system. FIG. 1 illustrates a configuration example of an inductively coupled plasma processing apparatus.

The plasma processing system includes an inductively coupled plasma processing apparatus 1 and a controller 2. The inductively coupled plasma processing apparatus 1 includes a plasma processing chamber 10, a gas supply 20, a power supply 30, and an exhaust system 40. The plasma processing chamber 10 includes a dielectric window. The plasma processing apparatus 1 also includes a substrate support 11, a gas inlet, and an antenna 14. The substrate support 11 is disposed in the plasma processing chamber 10. The antenna 14 is disposed on or above the plasma processing chamber 10 (i.e., on or above the dielectric window 101). The plasma processing chamber 10 has a plasma processing space 10s defined by the dielectric window 101, sidewalls 102 of the plasma processing chamber 10 and the substrate support 11. The plasma processing chamber 10 has at least one gas supply port for supplying at least one processing gas to the plasma processing space 10s and at least one gas exhaust port for exhausting gas from the plasma processing space. The plasma processing chamber 10 is grounded.

The substrate support 11 includes a body 111 and a ring assembly 112. The body 111 has a central region 111a for supporting a substrate W and an annular region 111b for supporting the ring assembly 112. A wafer is an example of the substrate W. The annular region 111b of the body 111 surrounds the central region 111a of the body 111 in plan view. The substrate W is disposed on the central region 111a of the body 111, and the ring assembly 112 is disposed on the annular region 111b of the body 111 so as to surround substrate W on the central region 111a of the body 111. Thus, the central region 111a is also referred to as a substrate support face for supporting the substrate W, and the annular region 111b is also referred to as a ring support face for supporting the ring assembly 112.

In one embodiment, the body 111 includes a base 1110 and an electrostatic chuck 1111. The base 1110 includes an electrically conductive member. The electrically conductive member of the base 1110 can function as a bias electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111b. Note that another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. At least one RF/DC electrode, which is coupled to a radio frequency (RF) power supply 31 and/or a direct current (DC) power supply 32 described below, may be disposed in the ceramic member 1111a. In this case, the at least one RF/DC electrode functions as a bias electrode. Note that the conductive member of the base 1110 and the at least one RF/DC electrode may function as a plurality of bias electrodes. Also, the electrostatic electrode 1111b may function as a bias electrode. Thus, the substrate support 11 includes at least one bias electrode.

The ring assembly 112 includes one or more annular members. In one embodiment, the one or more annular members include one or more edge rings and at least one cover ring. The edge ring(s) is formed from a conductive material or an insulating material, and the cover ring(s) is formed from an insulating material.

The substrate support 11 may include a temperature-controlled module configured to control at least one of the electrostatic chuck 1111, the ring assembly 112, and the substrate to a target temperature. The temperature-controlled module may include a heater, a heat transfer medium, a channel 1110*a*, or a combination of them. A heat transfer fluid, such as brine or gas, flows through the channel 1110*a*. In one embodiment, the channel 1110*a* is formed in the base 1110 and one or more heaters are disposed in the ceramic member 1111*a* of the electrostatic chuck 1111. The substrate support 11 may include a heat-transfer gas supply configured to supply a heat transfer gas to the gap between the rear face of the substrate W and the central region 111*a*.

The gas inlet is configured to introduce at least one processing gas from the gas supply 20 into the plasma processing space 10*s*. In one embodiment, the gas inlet includes a center gas injector (CGI) 13. The CGI 13 is disposed above the substrate support 11 and attached to a central opening formed in the dielectric window 101. The CGI 13 has at least one gas supply port 13*a*, at least one gas channel 13*b*, and at least one gas inlet port 13*c*. The processing gas supplied to the gas supply port 13*a* passes through the gas channel 13*b* and is introduced into the plasma processing space 10*s* from the gas inlet port 13*c*. In addition to or instead of the CGI 13, the gas inlet may include one or more side gas injectors (SGIs) attached to one or more openings formed in the side walls 102.

The gas supply 20 may include at least one gas source 21 and at least one flow rate controller 22. In one embodiment, the gas supply 20 is configured to supply at least one processing gas from a corresponding gas source 21 to the gas inlet via a corresponding flow rate controller 22. For instance, each flow rate controller 22 may include a mass flow controller or a pressure-controlled flow rate controller. The gas supply 20 also may include one or more flow rate modulation devices that modulate or pulse the flow rate of the at least one processing gas.

The power supply 30 includes a RF power supply 31 that is coupled to the plasma processing chamber 10 via at least one impedance matching circuit. The RF power supply 31 is configured to supply at least one RF signal (RF power) to the at least one bias electrode and the antenna 14. This forms a plasma from the at least one processing gas supplied to the plasma processing space 10*s*. Thus, the RF power supply 31 may function as at least part of a plasma generator that is configured to form a plasma from one or more processing gases in the plasma processing chamber 10. A bias RF signal, which is supplied to the at least one bias electrode, generates a bias potential in the substrate W, so that ions in the formed plasma can be drawn toward the substrate W.

In one embodiment, the RF power supply 31 includes a first RF generator 31*a* and a second RF generator 31*b*. The first RF generator 31*a* is coupled to the antenna 14 and configured to generate a source RF signal (source RF power) for plasma generation via at least one impedance matching circuit. In one embodiment, the source RF signal has a frequency in the range of 10 MHz to 150 MHz. In one embodiment, the first RF generator 31*a* may be configured to generate a plurality of source RF signals each having a different frequency. The generated one or more source RF signals are supplied to the antenna 14.

The second RF generator 31*b* is coupled to the at least one bias electrode via at least one impedance matching circuit and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within the range of 100 kHz to 60 MHz. In one embodiment, the second RF generator 31*b* may be configured to generate a plurality of bias RF signals each having a different frequency. The generated one or more bias RF signals are supplied to the at least one bias electrode. In various embodiments, at least one of the source RF signal and bias RF signal may be pulsed.

The power supply 30 may also include a DC power supply 32 that is coupled to the plasma processing chamber 10. The DC power supply 32 includes a bias DC generator 32*a*. In one embodiment, the bias DC generator 32*a* is connected to the at least one bias electrode and configured to generate a bias DC signal. The generated bias DC signal is applied to the at least one bias electrode.

In various embodiments, the bias DC signal may be pulsed. In this case, a sequence of voltage pulses is applied to the at least one bias electrode. The voltage pulses may have rectangular, trapezoidal, triangular waveforms or waveforms in a combination of them. In one embodiment, a waveform generator to generate a sequence of voltage pulses from DC signal is connected between the bias DC generator 32*a* and the at least one bias electrode. Thus, the bias DC generator 32*a* and the waveform generator constitute a voltage pulse generator. The voltage pulses may have a positive polarity or a negative polarity. The sequence of voltage pulses may include one or more positive voltage pulses or one or more negative voltage pulses in one cycle. The bias DC generator 32*a* may be provided in addition to the RF power supply 31, or may be provided instead of the second RF generator 31*b*.

The antenna 14 includes one or more coils. In one embodiment, the antenna 14 may include an outer coil and an inner coil that are coaxially arranged. In this case, the RF power supply 31 may be connected to both the outer coil and the inner coil, or may be connected to either one of the outer coil and the inner coil. In the former case, the same RF generator may be connected to both the outer and inner coils, or separate RF generators may be connected to the outer and inner coils separately.

For instance, the exhaust system 40 may be connected to a gas exhaust port 10*e* provided at the bottom of the plasma processing chamber 10. The exhaust system 40 may include a pressure regulation valve and a vacuum pump. The pressure regulation valve regulates the pressure in the plasma processing space 10*s*. The vacuum pump may include a turbomolecular pump, a dry pump, or a combination of these.

The controller 2 processes computer-executable instructions that cause the plasma processing apparatus 1 to perform various steps described in this disclosure. The controller 2 can be configured to control each element of the plasma processing apparatus 1 to perform various steps described herein. In one embodiment, part or all of the controller 2 may be included in the plasma processing apparatus 1. The controller 2 may include a processor 2*a*1, a storage 2*a*2, and a communication interface 2*a*3. For instance, the controller 2 is implemented by a computer 2*a*. The processor 2*a*1 can be configured to read a program from the storage 2*a*2 and execute the read program to perform various control operations. This program may be stored in the storage 2a2 in advance, or may be acquired via a medium when necessary. The acquired program is stored in the storage 2a2, and the processor 2a1 reads the program from the storage 2a2 for execution. The medium may be various storage media readable by the computer 2a, or may be a communication line connected to the communication interface 2a3. The processor 2a1 may be a central processing unit (CPU). The storage 2a2 may include random access memory (RAM), read only memory (ROM), hard disk drive (HDD), solid state drive (SSD), or a combination of them. The communication interface 2a3 may communicate with the plasma processing apparatus 1 via a communication line such as a local area network (LAN).

Example of Plasma Processing Method

Figure 2:
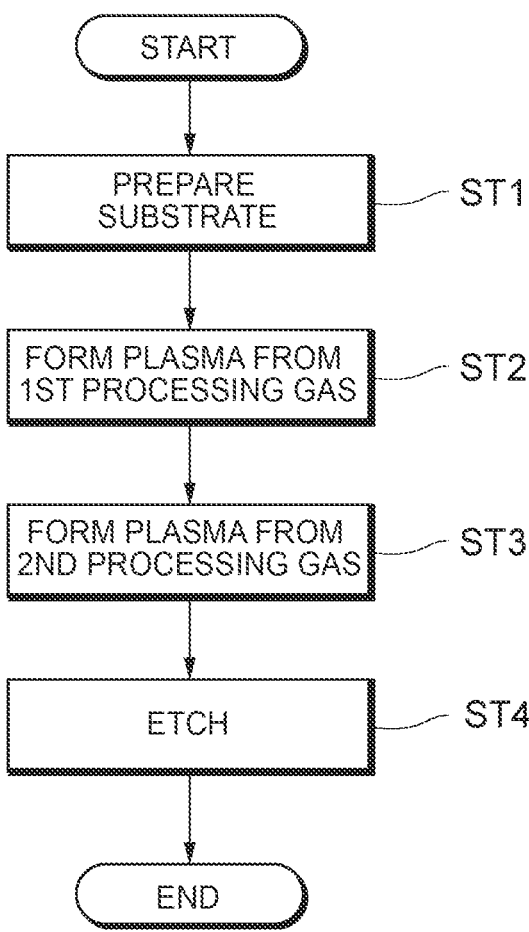
FIG. 2 is a flowchart illustrating an example of the present processing method.

FIG. 2 is a flowchart illustrating a plasma processing method (hereinafter also referred to as "this processing method") according to one exemplary embodiment. As illustrated in FIG. 2, this processing method includes step ST1 of preparing a substrate, step ST2 of forming a plasma from a first processing gas, and step ST3 of forming a plasma from a second processing gas. This processing method may further include step ST4 of etching. The process in each step may be performed with the plasma processing system illustrated in FIG. 1. The following describes the process by way of an example where the controller 2 controls each part of the plasma processing apparatus 1 to execute this processing method to a substrate W.

(Step ST1: Substrate Preparation)

In step ST1, the substrate W is prepared in the plasma processing space 10s of the plasma processing apparatus 1. The substrate W is provided on the central region 111a of the substrate support 11. Then, the substrate W is held on the substrate support 11 by the electrostatic chuck 1111.

Figure 3:
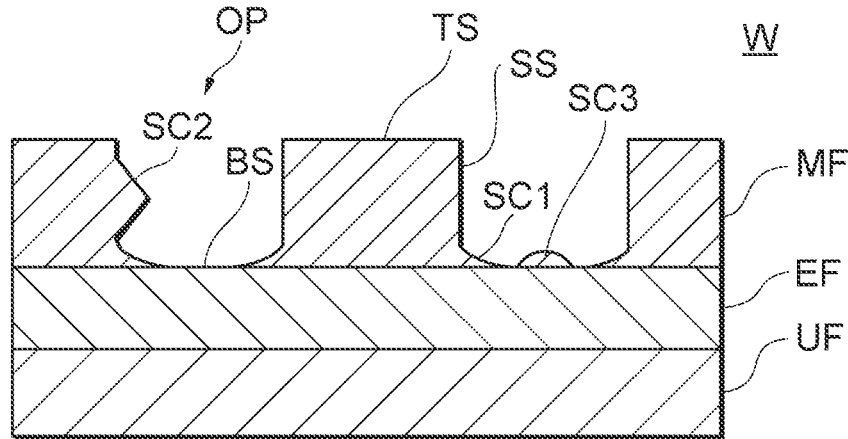
FIG. 3 illustrates an example of the cross-sectional structure of a substrate W supplied in step ST1.

FIG. 3 illustrates an example of the cross-sectional structure of the substrate W prepared in step ST1. The substrate W has an etching target film EF and a metal-containing film MF that are stacked in this order on an underlying film UF. The substrate W may be used in the manufacture of semiconductor devices. Semiconductor devices include semiconductor memory devices such as DRAM and 3D-NAND flash memory.

Examples of the underlying film UF include a silicon wafer or an organic film, dielectric film, metal film, or semiconductor film formed on a silicon wafer. The underlying film UF may include a stack of a plurality of films.

The etching target film EF is a film different from the underlying film UF. For instance, the etching target film EF may be an organic film, a dielectric film, a semiconductor film or a metal film. The etching target film EF may include a single film or a stack of films. For instance, the etching target film EF may include one or a stack of a silicon-containing film, a carbon-containing film, a spin-on-glass (SOG) film, a Si-containing anti-reflective film (SiARC), or other films.

The metal-containing film MF is a film containing at least one selected from the group consisting of tin (Sn), hafnium (Hf), indium (In), titanium (Ti), and zirconium (Zr). In one example, the metal-containing film MF may be a tin-containing film. The tin-containing film may contain at least one of tin oxide or tin hydroxide. The tin-containing film may contain an organic material. The tin-containing film may be an EUV resist film containing tin.

The metal-containing film MF has a top face TS, a side face SS continuous from the top face TS, and a bottom face in contact with the etching target film EF. The metal-containing film MF has at least one opening OP. The opening OP is defined by the side faces SS of the metal-containing film MF. The opening OP is a space on the etching target film EF surrounded by the side faces SS. That is, in FIG. 3, the top face of the etching target film EF has a portion covered with the metal-containing film MF and a portion exposed at the bottom face BS of the opening OP.

The opening OP may have any shape in plan view of the substrate W (when the substrate W is viewed from top to bottom in FIG. 3). For instance, the shape may be a circle, an ellipse, a rectangle, a line, or a shape combining one or more of these. The metal-containing film MF may have a plurality of openings OP. The plurality of openings OP may each have a hole shape and make an array pattern arranged at regular intervals. The plurality of openings OP may each have a linear shape and make a line and space pattern arranged at regular intervals.

At least a portion of the side face SS of the metal-containing film MF may have a portion SC extending toward the opening OP. For instance, the portion SC can be a portion SC1 that is on the outer edge of the bottom face BS of the opening OP. The portion SC can also be a protrusion SC2 protruding from the side face SS toward the opening OP in the region of the side face SS that is upwardly separated from the bottom face BS. These portions SC (SC1 and SC2) can be scum of the metal-containing film ME For instance, the scum can be residual resist that has not been completely removed in the process of forming the opening OP in the mask film MF (e.g., development process). In addition to the scum that is portions SC described above, the scum of the metal-containing film MF may include scum SC3. The scum SC3 is not connected to the side face SS of the metal-containing film MF and is isolated on the bottom face BS of the opening OP. The scum of the metal-containing film MF can also include scum (not illustrated) extending across the opening OP or spanning between the opposed side faces SS. The side face SS of the metal-containing film MF may have recesses (not illustrated) such as dents and cracks (including discontinuities in patterns such as line patterns).

Each film (underlying film UF, etching target film EF, metal-containing film MF) constituting the substrate W may be formed by methods such as chemical vapor deposition (CVD), atomic layer deposition (ALD), and spin coating. For instance, the metal-containing film MF may be formed by a vapor phase deposition method such as CVD, MLD or ALD, or by a liquid phase deposition method such as spin coating. Each of the above films may be a flat film, or may be a film having unevenness.

The opening OP may be formed to have a pattern by lithography. In one example, the patterning starts with the formation of a resist film containing metal such as tin on the etching target film EF. Then, the resist film is selectively irradiated with light (e.g., EUV excimer laser) through an exposure mask to expose the resist film with the light of a pattern having a shape corresponding to the exposure mask. Before exposure, pre-exposure baking for removing the solvent from the metal-containing film MF may be performed, and after exposure, post-exposure baking for curing the metal-containing film MF may be performed. Then, the exposed resist film is developed. The development may be performed by dry development using heat, plasma, or the like, or by wet development using developing liquid. For instance, when plasma is used for the development, the exposed resist film may be exposed to a plasma formed from a gas containing a halogen compound such as hydrogen fluoride. This may form the metal-containing film MF with the opening OP.

At least part of the process of forming each film of the substrate W may be performed in the space of the plasma processing chamber 10. For instance, the opening OP may be formed by etching the metal-containing film MF, and this step may be performed in the plasma processing chamber 10. To prepare the substrate, after all or some of the films of the substrate W is formed in a device or chamber outside the plasma processing apparatus 1, the substrate W may be conveyed into the plasma processing space 10s of the plasma processing apparatus 1 and disposed on the central region 111a of the substrate support 11.

After providing the substrate W on the central region 111a of the substrate support 11, the temperature of the substrate support 11 may be adjusted to a set temperature by the temperature-controlled module. The set temperature may be, for instance, a temperature of 70° C. or less (in one example, room temperatures). In one example, adjusting or maintaining the temperature of the substrate support 11 includes adjusting or maintaining the temperature of heat transfer fluid flowing through the channel 1110a at the set temperature or a temperature different from the set temperature. In one example, adjusting or maintaining the temperature of the substrate support 11 includes controlling the pressure of the heat transfer gas (e.g., He) between the electrostatic chuck 1111 and the rear face of the substrate W. The timing at which the heat transfer fluid begins to flow in the channel 1110a can be before or after the substrate W is placed on the substrate support 11 or at the same time as the placement. In this processing method, the temperature of the substrate support 11 may be adjusted to the set temperature before step ST1. That is, the substrate W may be provided on the substrate support 11 after the temperature of the substrate support 11 has been adjusted to the set temperature. In subsequent steps of this processing method, the temperature of the substrate support 11 may be maintained at the set temperature adjusted in step ST1.

(Step ST2: Form a Plasma from a First Processing Gas)

In step ST2, a plasma is formed from a first processing gas. First, the gas supply 20 supplies the first processing gas to the plasma processing space 10s. The first processing gas includes a gas containing silicon, carbon or metal. Next, a source RF signal is supplied to the antenna 14. This generates a RF electric field in the plasma processing space 10s, so that a plasma is formed from the first processing gas. No bias signal needs to be supplied to the lower electrode of the substrate support 11. In step ST2, the pressure in the plasma processing space 10s may be 50 millitorr (6.7 Pa) or less, for instance.

The first processing gas may include a gas containing carbon and hydrogen. For instance, the gas may be a hydrocarbon (CH-based gas), and in one example, may be $CH_4$ gas, $C_2H_2$ gas, $C_2H_4$ gas, or $C_3H_6$ gas. For instance, the gas may be a hydrofluorocarbon (CHF-based gas), and in one example, may be $CH_2F_2$ gas or $CH_3F$ gas. The first processing gas may further include inert gas such as noble gas or $N_2$ gas. When the first processing gas is a CH-based gas or a CHF-based gas, the power of the source RF signal supplied to antenna 14 may have output enough to dissociate these gases sufficiently. In one example, the power of the source RF signal may have the effective value that is 300 W or more, 500 W or more, 1,000 W or more, or 1,500 W or more.

The first processing gas may include a gas containing silicon or metal and halogen. For instance, the gas may be at least one selected from the group consisting of $SiCl_4$ gas, $SiF_4$ gas, Tick gas, $WF_6$ gas, and $MoF_6$ gas. Halogen in the gas dissociates in plasma and can etch the metal-containing film MF. The first processing gas may not contain any remaining gas (e.g., $H_2$ gas) that can etch the metal-containing film MF.

The first processing gas may further include inert gas such as noble gas or $N_2$ gas.

Figure 4A:
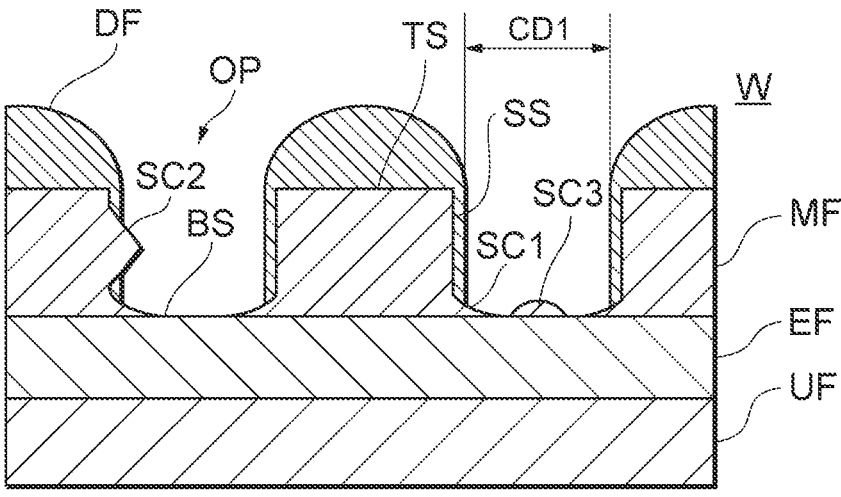
FIG. 4A illustrates an example of the cross-sectional structure of a substrate W after the process in step ST2.

FIG. 4A illustrates an example of the cross-sectional structure of a substrate W after the process in step ST2. FIG. 4A illustrates the example where the first processing gas includes a gas containing carbon and hydrogen. In this example, the metal-containing film MF is not substantially etched, and a deposited film DF is formed on the top face TS and side face SS of the metal-containing film MF. The deposited film DF is a carbon-containing film. The deposited film DF can be formed thicker on the top face TS than on the side face SS of the metal-containing film MF. As illustrated in FIG. 4A, part of the portion SC of the metal-containing film MF may protrude from the deposited film DF to be exposed to the opening OP. The deposited film DF is hardly formed on the bottom face BS of the opening OP, so that scum SC3 remains exposed to the opening OP. The dimensions CD1 (e.g., diameter or width) of the opening OP in the cross section illustrated in FIG. 4A can be smaller than those before the process in step ST2.

Figure 4B:
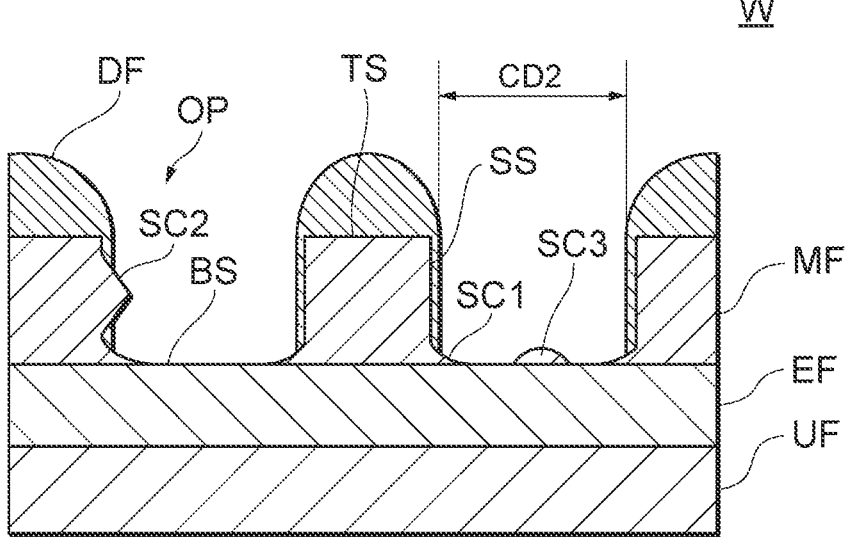
FIG. 4B illustrates another example of the cross-sectional structure of a substrate W after the process in step ST2.

FIG. 4B illustrates another example of the cross-sectional structure of a substrate W after the process in step ST2. FIG. 4B illustrates the example where the first processing gas includes a gas containing silicon or metal and halogen. In this example, part of the surface of the metal-containing film MF is etched by the halogen in the plasma, causing the metal-containing film MF to shrink, and a deposited film DF is formed on the shrunken metal-containing film MF. The deposited film DF containing silicon or metal can be thicker on the top face TS than on the side face SS of the metal-containing film MF. Part of the portion SC of the metal-containing film MF may protrude from the deposited film DF to be exposed to the opening OP. The deposited film DF is hardly formed on the bottom face BS of the opening OP, so that scum SC3 remains exposed to the opening OP. Part of the portion SC or scum SC3 can be etched by halogen in the plasma. The dimensions CD2 (e.g., diameter or width) of the opening OP in the cross section illustrated in FIG. 4B can be larger than those before the process in step ST2.

For the first processing gas, both a gas containing carbon and hydrogen and a gas containing silicon or metal and halogen may be used. In one example, the partial pressure of each gas in the first processing gas may be adjusted so that the dimensions (e.g., diameter and width) of the opening OP after the process in step ST2 are the same as those before the process in step ST2.

(Step ST3: Form a Plasma from a Second Processing Gas)

In step ST3, a plasma is formed from a second processing gas. First, the gas supply 20 supplies the second processing gas to the plasma processing space 10s. The second processing gas includes gases containing halogen other than fluorine or hydrogen-containing gases. Next, a source RF signal is supplied to the antenna 14. This generates a RF electric field in the plasma processing space 10s, and a plasma is formed from the second processing gas. In this step, a bias signal may be supplied to the lower electrode of the substrate support 11. In step ST3, the pressure in the plasma processing space 10s may be the same as the pressure in step ST2, or it may be different (e.g., higher pressure) from the pressure in step ST2.

The second processing gas may include gases containing halogen other than fluorine. In one example, the gas may be at least one selected from the group consisting of HBr gas, Br$_2$ gas, HCl gas and Cl$_2$ gas. The gas may be a gas that does not contain hydrogen, such as Br$_2$ gas or Cl$_2$ gas.

The second processing gas may include hydrogen-containing gases instead of or in addition to gases containing halogen other than fluorine. In one example, the hydrogen-containing gas may be H$_2$ gas.

The second processing gas may further include an oxygen-containing gas. When the first processing gas includes a carbon-containing gas, the second processing gas may further include an oxygen-containing gas. In one example, the oxygen-containing gas may be at least one gas selected from the group consisting of O$_2$, CO, CO$_2$, H$_2$O and H$_2$O$_2$. The second processing gas may further include inert gas such as noble gas or N$_2$ gas.

Figure 5A:
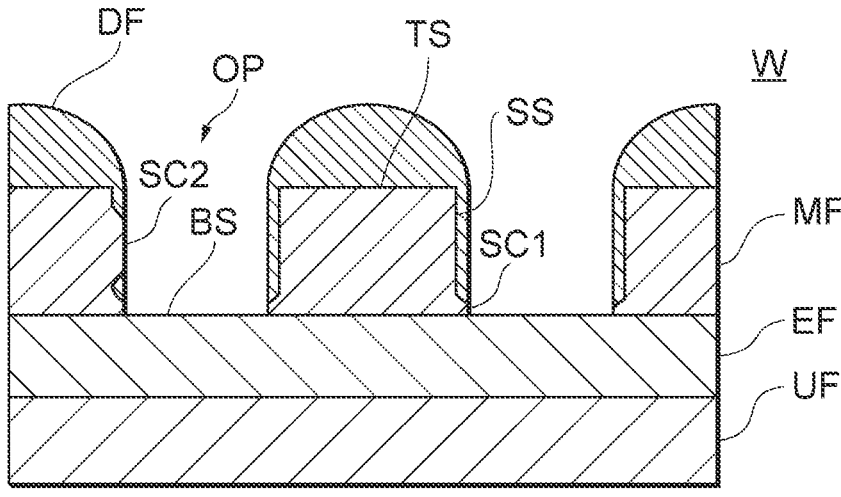
FIG. 5A illustrates an example of the cross-sectional structure of a substrate W after the process in step ST3.

FIG. 5A illustrates an example of the cross-sectional structure of the substrate W after the process in step ST3. FIG. 5A is an example when the substrate W illustrated in FIG. 4A is subjected to the process of step ST3. The deposited film DF contains carbon. The deposited film DF is less reactive with active species of halogens other than fluorine or hydrogen in the plasma formed from the second processing gas, thus providing a protection for the metal-containing film MF. This selectively etches the portion that was not covered with the deposited film DF after step ST2, as illustrated in FIG. 5A. That is, the portion SC protruding from the deposited film DF to be exposed to the opening OP and scum SC3 are removed. When the second processing gas contains an oxygen-containing gas, part of the deposited film DF can be etched. This allows the dimensions of the opening OP to be adjusted.

Figure 5B:
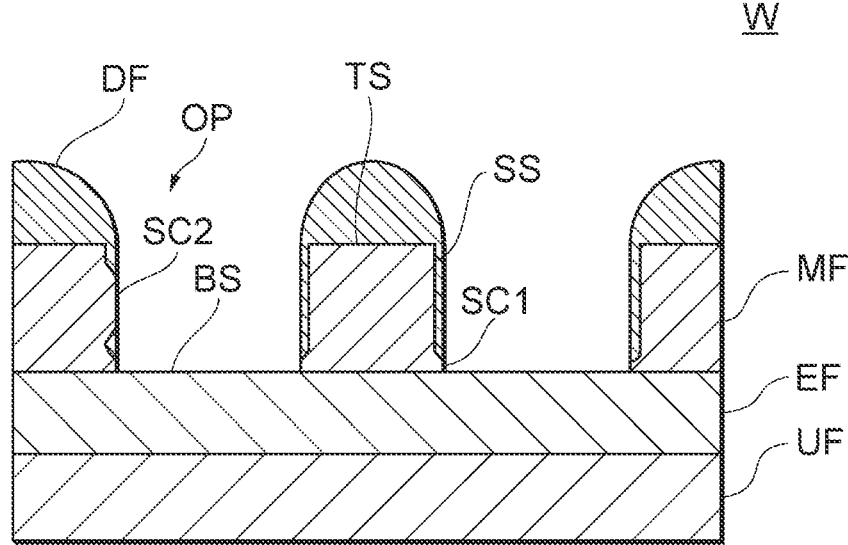
FIG. 5B illustrates another example of the cross-sectional structure of a substrate W after the process in step ST3.

FIG. 5B illustrates another example of the cross-sectional structure of the substrate W after the process in step ST3. FIG. 5B is an example when the substrate W illustrated in FIG. 4B is subjected to the process of step ST3. The deposited film DF contains silicon or metal. The deposited film DF is less reactive with active species of halogens other than fluorine or hydrogen in the plasma formed from the second processing gas, thus providing a protection for the metal-containing film MF. This selectively etches the portion that was not covered with the deposited film DF after step ST2, as illustrated in FIG. 5B. That is, the portion SC protruding from the deposited film DF to be exposed to the opening OP and scum SC3 are removed.

(Step ST4: Etching)

In step ST4, the etching target film EF is etched. First, the gas supply 20 supplies a third processing gas to the plasma processing space 10s. Next, a source RF signal is supplied to the antenna 14, thus forming a plasma from the third processing gas. A bias signal is supplied to the lower electrode of the substrate support 11, so that a bias potential is generated between the plasma and the substrate W. This attracts active species such as ions and radicals in the plasma to the substrate W, and the etching target film EF is etched by the active species.

Figure 6A:
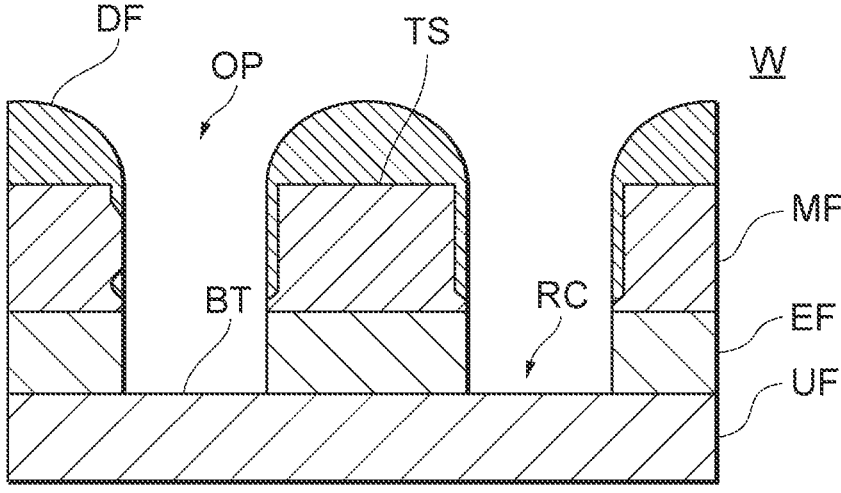
FIG. 6A illustrates an example of the cross-sectional structure of a substrate W after the process in step ST4.
Figure 6B:
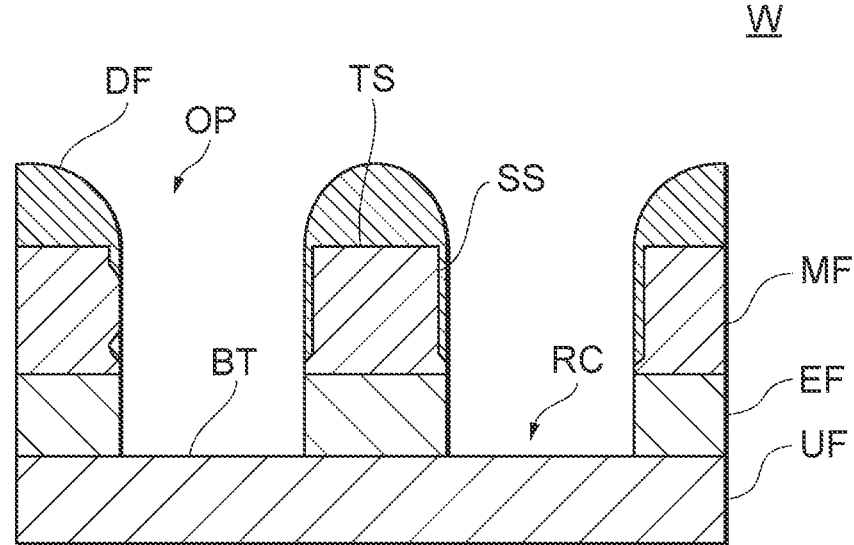
FIG. 6B illustrates another example of the cross-sectional structure of a substrate W after the process in step ST4.

FIG. 6A illustrates an example of the cross-sectional structure of the substrate W after the process in step ST4. FIG. 6A is an example when the substrate W illustrated in FIG. 5A is subjected to the process of step ST4. FIG. 6B illustrates another example of the cross-sectional structure of the substrate W after the process in step ST4. FIG. 6B is an example when the substrate W illustrated in FIG. 5B is subjected to the process of step ST4. In step ST4, the metal-containing film MF and/or deposited film DF acts as a mask and the etching target film EF is etched. As illustrated in FIGS. 6A and 6B, in step ST4, recesses RC are formed in the etching target film EF based on the shape of the opening OP of the metal-containing film MF.

In this processing method, the deposited film DF is formed on the metal-containing film MF without or while etching the metal-containing film MF. This allows the dimensions (e.g., diameter and width) of the opening OP of the mask film MF to be properly controlled.

This processing method forms the deposited film DF on the metal-containing film MF, even if there are dents or cracks on the side face SS of the metal-containing film MF, thus filling or reducing these dents or others. This processing method forms the deposited film DF on the metal-containing film MF and then removes the portion SC protruding from the deposited film DF to be exposed to the opening OP. This reduces the surface roughness of the side faces defining the opening OP. Even if scum or others of the metal-containing film MF exists at the bottom of the opening OP, the method removes or reduces the scum. That is, this method reduces defects in the metal-containing film MF.

When etching the etching target film EF using this metal-containing film MF and/or deposited film DF as a mask, the method appropriately controls the dimensions and shape of the recesses RC formed in the etching target film EF.

EXAMPLES

The following describes examples of this processing method. This disclosure is in no way limited by the following examples.

Example 1

In Example 1, the present processing method was performed to the substrate W with the plasma processing apparatus 1. The substrate W in Example 1 was configured so that a SOC film (underlying film UF), a SOG film (etching target film EF) and a tin-containing resist film (metal-containing film MF) were stacked in this order (see FIG. 3). The opening OP had a line pattern. In step ST2, CH$_4$ gas and N$_2$ gas were used as the first processing gas. The power of the source RF signal was 1,500 W. In step ST3, O$_2$ gas, HBr gas, and Ar gas were used as the second processing gas. The power of the source RF signal and bias RF signal were 100 W and 30 W, respectively.

Example 2

In Example 2, a substrate W having the same structure as in Example 1 was used. The opening OP had a line pattern. In step ST2, SiCl$_4$ gas and Ar gas were used as the first processing gas. The power of the source RF signal was 500 W. In step ST3, HBr gas, and Ar gas were used as the second processing gas. The power of the source RF signal and bias RF signal were 100 W and 30 W, respectively.

Table 1 shows the measurement results of LCD and LWR after the process in step ST3. The "initial state" is the measurement result of the substrate W before processing in this processing method. "LCD" is the average value of the line width of the metal-containing film MF (including the deposited film DF in Examples 1 and 2) in plan view of the substrate W, and "LWR" is the line width roughness.

TABLE 1

|  | Initial state | Example 1 | Example 2 |
|---|---|---|---|
| LCD [nm] | 14.48 | 18.43 | 15.06 |
| LWR [nm] | 3.29 | 2.71 | 2.37 |

As shown in Table 1, LWR was improved in both Example 1 and Example 2. LCDs also increased in both Example 1 and Example 2. That is, the dimension (width) of the opening OP was adjusted.

Modified Examples

Various modifications may be made to this processing method without departing from the scope and spirit of this disclosure.

For instance, in the flowchart of FIG. 2, step ST2 and step ST3 may be alternately repeated multiple times before proceeding to step ST4. The period for performing step ST2 and the period for performing step ST3 may at least partially overlap. Step ST2 and step ST3 may be performed at the same time. After step ST1, at least part of the side face SS of the metal-containing film MF may be removed by using a plasma formed from the second processing gas, and then the process in step ST2 may be performed.

For instance, in the flowchart in FIG. 2, step ST3 may be omitted. That is, the etching in step ST4 may be performed following the process in step ST2.

For instance, in the flowchart in FIG. 2, step ST4 may be omitted. For instance, in step ST3, the plasma formed from the second processing gas may be used to remove the portion SC and scum SC3 while etching the etching target film EF.

In the example described referring to FIG. 2, different processing gases (first processing gas and second processing gas) are used between in step ST2 and in step ST3 to form (deposit) the deposited film DF and remove part of the metal-containing film MF (scum removal). The method is not limited to this example. For instance, the deposition and the scum removal may be performed by controlling the supply (on/off) of the source RF signal and/or the bias signal or controlling their signal level (power level or voltage level).

Specifically, after the substrate W is provided to the substrate support 11 in step ST1, a fourth processing gas is supplied to the plasma processing chamber 10. For instance, the fourth processing gas may be at least one selected from the group consisting of $CH_4$ gas, $CH_3F$ gas, $CH_2F_2$ gas, $CHF_3$ gas, $CCl_4$ gas, $CHCl_3$ gas, $CH_2Cl_2$ gas, $CH_3Cl$ gas, $SiCl_4$ gas, $Si_2Cl_6$ gas, $SiF_4$ gas, $SiH_4$ gas, $WF_6$ gas, $MoF_6$ gas, $TiCl_4$ gas, $SnCl_4$ gas, $H_2$ gas, HF gas, HCl gas, HBr gas, $Cl_2$ gas, $Br_2$ gas, and $N_2$ gas.

Source RF and bias signals are then supplied to the plasma processing chamber 10 to form a plasma from the fourth processing gas. At this time, a first period of supplying the bias signal at a first level and a second period of not supplying the bias signal or supplying the bias signal at a second level lower than the first level are repeated. This allows scum removal and deposition to alternate between the first and second periods. In this first period, the source RF signal may be supplied at a third level, and in the second period, the source RF signal may not be supplied or may be supplied at a fourth level lower than the third level.

For instance, this processing method may be performed using another substrate processing apparatus including any plasma source, such as capacitively coupled plasma or microwave plasma, other than the inductively coupled substrate processing apparatus 1.

One exemplary embodiment of the present disclosure provides a technique capable of controlling of the opening dimensions in the substrate.

Embodiments of the present disclosure may include the following aspects.

(Addendum 1)

A plasma processing method performed with a plasma processing apparatus including a chamber, including:

(a) preparing a substrate on a substrate support in the chamber, the substrate including an etching target film and a metal-containing film, the metal-containing film being formed on the etching target film and including a side face defining at least one opening on the etching target film;

(b) forming a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

(Addendum 2)

The plasma processing method according to addendum 1, wherein the metal-containing film includes at least one selected from the group consisting of Sn, Hf, In, Ti and Zr.

(Addendum 3)

The plasma processing method according to addendum 1, wherein the metal-containing film includes Sn.

(Addendum 4)

The plasma processing method according to addendum 1, wherein the metal-containing film includes an EUV resist film containing Sn.

(Addendum 5)

The plasma processing method according to any one of addenda 1 to 4, wherein in (b), the plasma formed from the first processing gas is used to etch the surface of the metal-containing film and form the deposited film.

(Addendum 6)

The plasma processing method according to addendum 5, wherein the first processing gas includes a gas containing silicon or metal and halogen.

(Addendum 7)

The plasma processing method according to addendum 6, wherein the first processing gas includes at least one selected from the group consisting of $SiCl_4$ gas, $SiF_4$ gas, $TiCl_4$ gas, $WF_6$ gas, and $MoF_6$ gas.

(Addendum 8)

The plasma processing method according to any one of addenda 1 to 4, wherein in (b), the plasma formed from the first processing gas is used to form the deposited film without substantially etching the surface of the metal-containing film.

(Addendum 9)

The plasma processing method according to addendum 8, wherein the first processing gas includes a gas containing carbon and hydrogen.

(Addendum 10)

The plasma processing method according to addendum 9, wherein the first processing gas includes at least one selected from the group consisting of $CH_4$ gas, $CH_2F_2$ gas and $CH_3F$ gas.

(Addendum 11)

The plasma processing method according to any one of addenda 1 to 4, wherein the first processing gas includes both a gas containing silicon or metal and halogen, and a gas containing carbon and hydrogen.

(Addendum 12)

The plasma processing method according to any one of addenda 1 to 11, wherein in (b), no bias signal is supplied to the substrate support.

(Addendum 13)

The plasma processing method according to any one of addenda 1 to 12, wherein the second processing gas includes a gas containing halogen other than fluorine or hydrogen-containing gas.

(Addendum 14)

The plasma processing method according to addendum 13, wherein the second processing gas includes at least one selected from the group consisting of HBr gas, $Br_2$ gas, HCl gas, $Cl_2$ gas and $H_2$ gas.

(Addendum 15)

The plasma processing method according to addendum 13 or 14, wherein the second processing gas further includes at least one of an oxygen-containing gas and an inert gas.

(Addendum 16)

The plasma processing method according to any one of addenda 1 to 15, wherein (b) and (c) are repeated.

(Addendum 17)

The plasma processing method according to any one of addenda 1 to 16, wherein the period for performing (b) and the period for performing (c) at least partially overlap.

(Addendum 18)

The plasma processing method according to any one of addenda 1 to 17, wherein (b) and (c) are performed simultaneously.

(Addendum 19)

The plasma processing method according to any one of addenda 1 to 18, further including removing at least a portion of the side face of the metal-containing film using a plasma formed from the second processing gas after (a) and before (b).

(Addendum 20)

The plasma processing method according to any one of addenda 1 to 19, wherein in (c), a portion of the side face of the metal-containing film that extends toward the opening is removed using a plasma formed from the second processing gas.

(Addendum 21)

The plasma processing method according to any one of addenda 1 to 20, further including, after (c), etching the etching target film using the metal-containing film with the deposited film formed thereon as a mask.

(Addendum 22)

The plasma processing method according to any one of addenda 1 to 21, wherein (c) includes etching the etching target film using the metal-containing film with the deposited film formed thereon as a mask.

(Addendum 23)

A plasma processing method performed with a plasma processing apparatus including a chamber, including:

(a) preparing a substrate on a substrate support in the chamber, the substrate including an etching target film and a metal-containing film, the metal-containing film being formed on the etching target film and including a side face defining at least one opening on the etching target film; and (b) forming a deposited film on at least a portion of the surface of the metal-containing film using a plasma formed from a first processing gas, the first processing gas including a gas containing silicon, carbon or metal.

(Addendum 24)

The plasma processing method according to addendum 23, further including, after step (b), etching the etching target film using the metal-containing film with the deposited film formed thereon as a mask.

(Addendum 25)

A plasma processing method performed with a plasma processing apparatus including a chamber, including:

(a) preparing a substrate on a substrate support in the chamber, the substrate including an etching target film and a metal-containing film, the metal-containing film being formed on the etching target film and including a side face defining at least one opening on the etching target film;

(b) supplying a processing gas into the chamber; and (c) forming a plasma from the processing gas, (c) repeating:

(c1) a first period of supplying a bias signal at a first level to the substrate support; and (c2) a second period of not supplying a bias signal to the substrate support, or supplying a bias signal at a second level that is lower than the first level to the (Addendum 26)

The plasma processing method according to addendum 25, wherein the processing gas includes at least one selected from the group consisting of $CH_4$ gas, $CH_3F$ gas, $CH_2F_2$ gas, $CHF_3$ gas, $CCl_4$ gas, $CHCl_3$ gas, $CH_2Cl_2$ gas, $CH_3Cl$ gas, $SiCl_4$ gas, $Si_2Cl_6$ gas, $SiF_4$ gas, $SiH_4$ gas, $WF_6$ gas, $MoF_6$ gas, $TiCl_4$ gas, $SnCl_4$ gas, $H_2$ gas, HF gas, HCl gas, HBr gas, $Cl_2$ gas, $Br_2$ gas, and $N_2$ gas.

(Addendum 27)

The plasma processing method according to addendum 25, wherein in (c), in the first period, a source RF signal is supplied at a third level, and in the second period, a source RF signal is not supplied or is supplied at a fourth level lower than the third level.

(Addendum 28)

A plasma processing system including a chamber, a substrate support disposed in the chamber, a plasma generator, and a controller, the controller being configured to perform:

(a) preparing a substrate on a substrate support in the chamber, the substrate including an etching target film and a metal-containing film disposed on the etching target film, the metal-containing film including a side face defining at least one opening on the etching target film;

(b) controlling to form a deposited film on at least a portion of the surface of the metal-containing film using a plasma formed from a first processing gas, the first processing gas including a gas containing silicon, carbon or metal; and (c) removing at least a portion of the side face of the metal-containing film using a plasma formed from a second processing gas.

What is claimed is:

1. A plasma processing method performed with a plasma processing apparatus including a chamber, comprising:

(a) preparing a substrate on a substrate support in the chamber, the substrate including an etching target film and a metal-containing film, the metal-containing film being formed on the etching target film and including a side face defining at least one opening on the etching target film;

(b) forming a deposited film on at least a portion of a surface of the metal-containing film using a plasma formed from a first processing gas, the first processing gas including a gas containing silicon, carbon or metal; and (c) removing at least a portion of the side face of the metal-containing film using a plasma formed from a second processing gas, wherein a period for performing (b) and the period for performing (c) at least partially overlap.

2. The plasma processing method according to claim 1, wherein the metal-containing film includes at least one selected from the group consisting of Sn, Hf, In, Ti and Zr.

3. The plasma processing method according to claim 2, wherein the deposited film is formed thicker on a top face of the metal-containing film than on a side face of the metal-containing film.

4. The plasma processing method according to claim 2, wherein the first processing gas includes a gas containing silicon or metal and halogen.

5. The plasma processing method according to claim 1, wherein the metal-containing film includes Sn.

6. The plasma processing method according to claim 1, wherein the metal-containing film includes an EUV resist film containing Sn.

7. The plasma processing method according to claim 1, wherein in (b), the plasma formed from the first processing gas is used to etch the surface of the metal-containing film and form the deposited film.

8. The plasma processing method according to claim 7, wherein the first processing gas includes a gas containing silicon or metal and halogen.

9. The plasma processing method according to claim 8, wherein the first processing gas includes at least one selected from the group consisting of $SiCl_4$ gas, $SiF_4$ gas, $TiCl_4$ gas, $WF_6$ gas, and $MoF_6$ gas.

10. The plasma processing method according to claim 1, wherein in (b), the plasma formed from the first processing gas is used to form the deposited film without substantially etching the surface of the metal-containing film.

11. The plasma processing method according to claim 1, wherein in (b), no bias signal is supplied to the substrate support.

12. The plasma processing method according to claim 1, wherein the second processing gas includes a gas containing halogen other than fluorine or hydrogen-containing gas.

13. The plasma processing method according to claim 12, wherein the second processing gas includes at least one selected from the group consisting of HBr gas, Br, gas, HCl gas, $Cl_2$ gas and $H_2$ gas.

14. The plasma processing method according to claim 1, wherein the second processing gas further includes at least one of an oxygen-containing gas and an inert gas.

15. The plasma processing method according to claim 1, wherein (b) and (c) are repeated.

16. The plasma processing method according to claim 1, wherein (b) and (c) are performed simultaneously.

17. The plasma processing method according to claim 1, further including, after (c), etching the etching target film using the metal-containing film with the deposited film formed thereon as a mask.

18. A plasma processing method performed with a plasma processing apparatus including a chamber, comprising:
   (a) preparing a substrate on a substrate support in the chamber, the substrate including an etching target film and a metal-containing film, the metal-containing film being formed on the etching target film and including a side face defining at least one opening on the etching target film;
   (b) forming a deposited film on at least a portion of a surface of the metal-containing film using a plasma formed from a first processing gas, the first processing gas including a gas containing carbon and hydrogen and at least one of silicon or metal; and (c) removing at least a portion of the side face of the metal-containing film using a plasma formed from a second processing gas,
   wherein the first processing gas includes a gas containing carbon and hydrogen.

19. The plasma processing method according to claim 18, wherein the first processing gas includes at least one selected from the group consisting of $CH_4$ gas, $CH_2F_2$ gas and $CH_3F$ gas.

20. A plasma processing method performed with a plasma processing apparatus including a chamber, comprising:
   preparing a substrate on a substrate support in the chamber, the substrate including an etching target film and a metal-containing film, the metal-containing film being formed on the etching target film and including a side face defining at least one opening on the etching target film;
   in response to removing at least a portion of the side face of the metal-containing film using a plasma formed from a second processing gas, forming a deposited film on at least a portion of a surface of the metal-containing film using a plasma formed from a first processing gas, the first processing gas including a gas containing silicon, carbon or metal;
   removing at least a portion of the side face of the metal-containing film using a plasma formed from the second processing gas; and
   removing at least a portion of the side face of the metal-containing film using the plasma formed from the second processing gas after (a) and before (b).

21. A plasma processing method performed with a plasma processing apparatus including a chamber, comprising:
   (a) preparing a substrate on a substrate support in the chamber, the substrate including an etching target film and a metal-containing film, the metal-containing film being formed on the etching target film and including a side face defining at least one opening on the etching target film;
   (b) forming a deposited film on at least a portion of a surface of the metal-containing film using a plasma formed from a first processing gas, the first processing gas including a gas containing silicon, carbon or metal; and
   (c) removing at least a portion of the side face of the metal-containing film using a plasma formed from a second processing gas,
   wherein in (c), a portion of the side face of the metal-containing film that extends toward the opening is removed using the plasma formed from the second processing gas.

22. A plasma processing method performed with a plasma processing apparatus including a chamber, comprising:
   (a) preparing a substrate on a substrate support in the chamber, the substrate including an etching target film and a metal-containing film, the metal-containing film being formed on the etching target film and including a side face defining at least one opening on the etching target film;
   (b) forming a deposited film on at least a portion of a surface of the metal-containing film using a plasma formed from a first processing gas, the first processing gas including a gas containing silicon, carbon or metal; and
   (c) removing at least a portion of the side face of the metal-containing film using a plasma formed from a second processing gas, wherein (c) includes etching the etching target film using the metal-containing film with the deposited film formed thereon as a mask.

23. A plasma processing method performed with a plasma processing apparatus including a chamber, comprising:

(a) preparing a substrate on a substrate support in the chamber, the substrate including an etching target film and a metal-containing film, the metal-containing film being formed on the etching target film and including a side face defining at least one opening on the etching target film; and (b) forming a deposited film on at least a portion of a surface of the metal-containing film using a plasma formed from a first processing gas, the first processing gas including a gas containing:

carbon and hydrogen; and at least one of silicon or a metal.

24. The plasma processing method according to claim 23, further including, after step (b), etching the etching target film using the metal-containing film with the deposited film formed thereon as a mask.

* * * * *